(12) United States Patent
Yoo

(10) Patent No.: US 7,063,583 B2
(45) Date of Patent: Jun. 20, 2006

(54) MULTI-SPECTRAL UNIFORM LIGHT SOURCE

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 280 days.

(21) Appl. No.: 09/815,678

(22) Filed: Mar. 23, 2001

(65) Prior Publication Data

US 2002/0136018 A1    Sep. 26, 2002

(51) Int. Cl.
*H01J 9/395* (2006.01)

(52) U.S. Cl. .................... 445/16; 445/38

(58) Field of Classification Search ............ 445/16, 445/53, 56, 57, 70, 73, 38, 40–42, 9–10; 313/222

See application file for complete search history.

(56) References Cited

U.S. PATENT DOCUMENTS

| | | | | |
|---|---|---|---|---|
| 1,602,634 A | * | 10/1926 | Anderson | 313/553 |
| 3,377,496 A | | 4/1968 | Fruengel et al. | 313/175 |
| 3,529,208 A | * | 9/1970 | Frungel | 315/110 |
| 3,701,368 A | * | 10/1972 | Stern | 141/1 |
| 4,005,324 A | * | 1/1977 | Dolenga et al. | 313/579 |
| 4,303,290 A | * | 12/1981 | Tsunekawa et al. | 445/55 |
| 4,337,414 A | | 6/1982 | Young | 315/56 |
| 4,364,617 A | * | 12/1982 | Moriwaki et al. | 445/53 |
| 4,535,268 A | * | 8/1985 | Morris et al. | 313/569 |
| 4,578,043 A | * | 3/1986 | Teshima et al. | 445/40 |
| 4,861,302 A | * | 8/1989 | Antal et al. | 445/38 |
| 4,993,981 A | * | 2/1991 | Ose et al. | 445/9 |
| 5,213,537 A | * | 5/1993 | Roberts et al. | 445/53 |
| 5,220,249 A | | 6/1993 | Tsukada | 315/246 |
| 5,356,657 A | * | 10/1994 | Terada et al. | 427/66 |
| 5,384,709 A | * | 1/1995 | Seder et al. | 700/117 |
| 5,387,837 A | | 2/1995 | Roelevink et al. | 343/484 |
| 5,466,990 A | | 11/1995 | Winsor | 315/56 |
| 5,496,201 A | * | 3/1996 | Hwang | 445/38 |
| 5,722,761 A | | 3/1998 | Knight | 362/96 |
| 5,725,299 A | | 3/1998 | Devorris | 362/216 |
| 5,735,595 A | | 4/1998 | Nederpel et al. | 362/223 |
| 5,775,801 A | | 7/1998 | Shaffer | 362/310 |
| 5,841,220 A | | 11/1998 | Ooms | 313/565 |
| 5,909,085 A | | 6/1999 | Nelson | 315/94 |

FOREIGN PATENT DOCUMENTS

| | | |
|---|---|---|
| EP | 0638918 A1 | 2/1995 |
| WO | WO00/26029 | 5/2000 |

* cited by examiner

*Primary Examiner*—Joseph Williams
*Assistant Examiner*—Dalei Dong
(74) *Attorney, Agent, or Firm*—MacPherson Kwok Cher & Heid LLP; David S. Park

(57) ABSTRACT

A multi-spectral uniform light source provides a single light source for a variety of applications. The gas or gases inside the light source may be exchanged for another gas or gases depending on the desired application and need for a particular wavelength of emitted light.

12 Claims, 11 Drawing Sheets

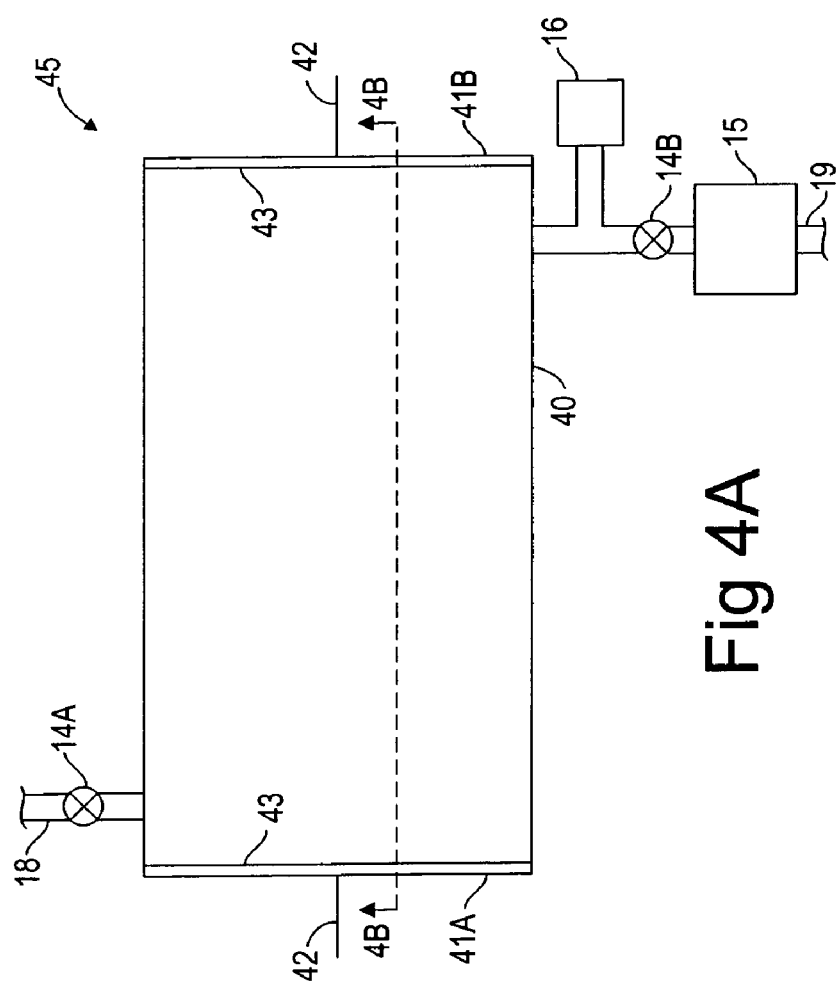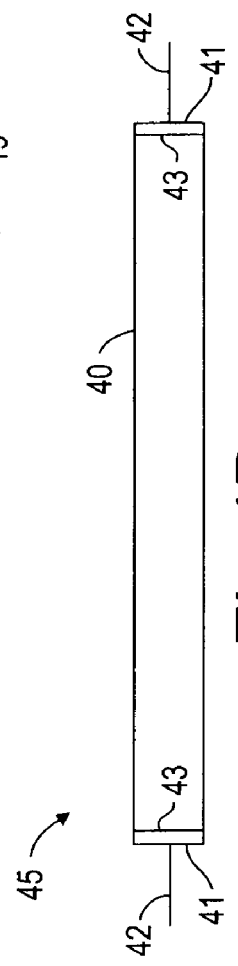
Fig 4A
Fig 4B

MULTI-SPECTRAL UNIFORM LIGHT SOURCE

BACKGROUND OF THE INVENTION

1. Field of the Invention

This invention relates generally to gas discharge light sources and more particularly to gas exchangeable light sources.

2. Description of Related Art

Light sources are used for any number of applications requiring light, including but not limited to U.V. cleaning, U.V. curing, annealing, drying, photo enhanced processing, sterilization, backlighting, signs and U.V. light. However, such light sources tend to be limited to a single application, may lack uniformity of illumination, and are only useful in a limited number of environments. Therefore, in order to accomplish a variety of different applications, a number of different light sources are required; each intended for a specific purpose. This may require, for example, that a workpiece be moved around to several different stations, each station with its own light source for a specific purpose.

A need exists for a lamp that does not need to be replaced on an application by application basis but rather is capable of use in a number of applications by changing the lamp characteristics.

SUMMARY OF THE INVENTION

In accordance with this invention, a multi-purpose, multi-spectral light source allows gases inside a light source to be exchanged. An advantage of the present invention is that the light source is not limited to a single gas. The gases within the light source may be exchanged in order to use the same light source for a variety of different applications which require different spectrums of light. Each gas emits a particular spectrum of light which is useful for a number of applications. The instant invention may be used for any number of applications requiring light, including but not limited to wafer surface conditioning, U.V. cleaning, wafer heating, U.V. curing, annealing, drying, enhancing photo-chemical reaction, photo enhanced processing, sterilization, backlighting, signs, and U.V. light.

In accordance with one embodiment of this invention, a light source serves a variety of applications by merely exchanging the gas(es) within the light source. In another embodiment of this invention, constant pressure and/or constant current may be maintained within the light source during gas exchange.

In accordance with one embodiment of this invention, a multi-spectral light source includes a hollow vessel with a first end and a second end; a first valve located at the first end; a second valve located at the second end; an electrode located at each end; and a pump for pumping a gas into and out of the vessel. The vessel includes a hollow tube in a variety of cross-sectional as well as longitudinal shapes. The gases used include, but are not limited to, krypton (Kr), argon (Ar), neon (Ne), xenon (Xe), helium (He), mercury (Hg), neon/helium mixture, neon/argon mixture, oxygen ($O_2$), hydrogen ($H_2$), ditrium ($D_2$), nitrogen ($N_2$) and various mixtures of the preceding gases. All gases can be mixed except for hydrogen and oxygen.

The gases in the light source may be exchanged in order to use the same light source for a variety of different applications which require different spectrums of light. The gases are exchanged by unsealing the seals of the light source; pumping a first gas initially located within the light source out of the light source; pumping a second gas into the light source; and then sealing each seal of the light source. A variety of valves are used to seal and unseal the light source.

By changing the type of gas used inside the light source, gas pressure inside the light source, excitation level (i.e., the voltage, current, and/or frequency required to illuminate the light source) or excitation method (i.e., whether the lamp is illuminated by conventional means, microwave or RF), the lamp of this invention will emit different spectra of light. Thus, the characteristics of the light source can be modulated when the light source is in use. The single light source of this invention replaces the use of a number of different light sources. For example, instead of being required to move a workpiece around to several different stations, each station with its own light source for a specific purpose, a single station using the multi-spectral light source of this invention can replace these several different stations.

This invention will be more fully understood in light of the following detailed description taken together with the accompanying drawings.

BRIEF DESCRIPTION OF THE DRAWINGS

FIG. 4A illustrates a plan view of a rectangular-shaped planar light source.

FIG. 4B illustrates the side view cross-section of the rectangular-shaped planar light source of FIG. 4A.

Use of the same reference symbols in different figures indicates similar or identical items.

DETAILED DESCRIPTION OF THE PREFERRED EMBODIMENTS

A multi-purpose, multi-spectral light source is disclosed that allows gases inside a light source to be exchanged. As the light source is not limited to a single gas, the gases in the light source may be exchanged in order to use the same light source for a variety of different applications which require different spectrums of light. The instant invention may be used for any number of applications requiring light, including but not limited to U.V. cleaning, U.V. curing, annealing, drying, photo enhanced processing, sterilization, backlighting, signs, and U.V. light. The invention uses various-shaped tubes, a combination of valves, pressure gauges, and a gas pump to exchange the type of gas used inside the tube.

Figure 1A:
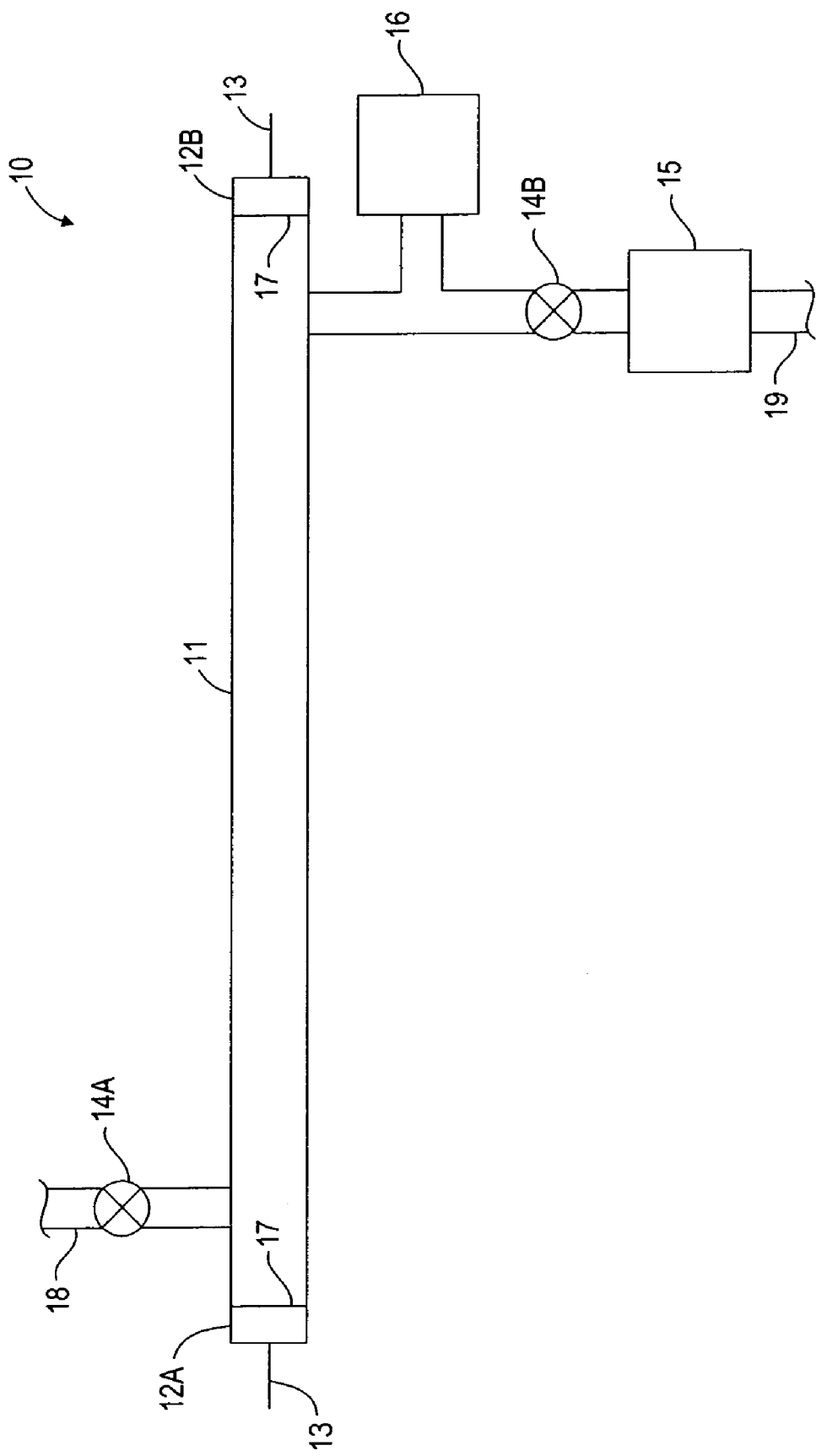
FIG. 1A illustrates a straight light source.

In accordance with an embodiment of the invention, one embodiment of the invention includes a straight tube, as seen in FIG. 1A, at constant pressure and constant current. This light source 10 includes a single tube or envelope 11 with two sealed ends 12A, 12B. Each end 12A, 12B of tube 11 includes an endcap 17 which further includes an electrode 13 for power, as described in more detail below.

Figure 1B:
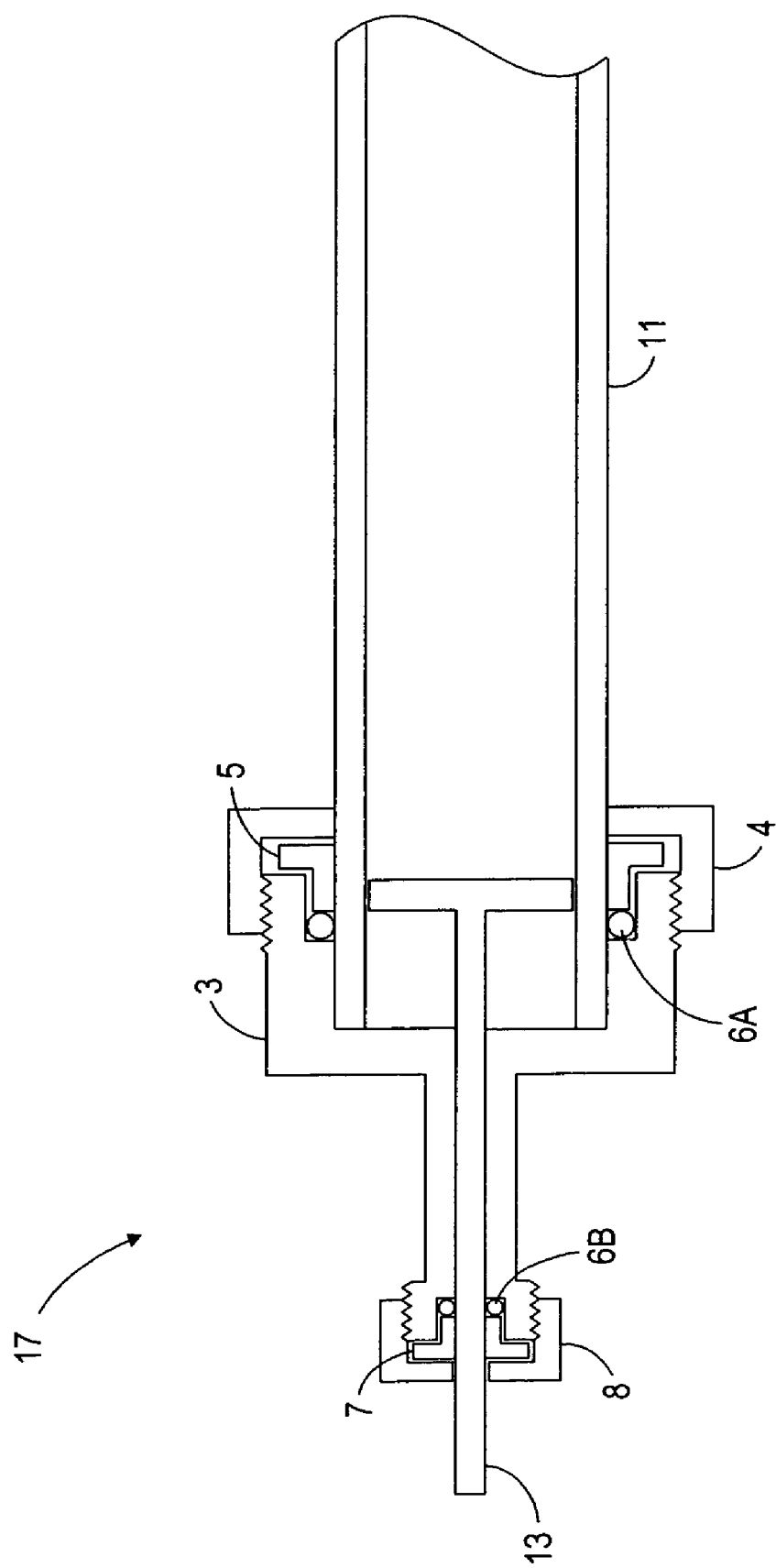
FIG. 1B illustrates a cross-sectional view of an endcap connected to the straight light source of FIG. 1A.

In accordance with an embodiment of the invention, FIG. 1B illustrates endcap 17 of the straight light source of FIG. 1A. Endcaps are well-known in the art and will be described as follows only in the most general terms. Endcap 17 includes a ceramic body 3, threaded on each end, with a central opening running along the length of body 3. A first U-shaped cap 4 with a central opening slightly larger than the exterior shape of tube 11 is mounted on tube 11. The inner surface of cap 4 is threaded so as to mate with one of the threaded ends of body 3. A first guide ring 5 with a central opening slightly larger than the exterior shape of tube 11 is placed on tube 11 and placed in contact with cap 4. An O-ring 6A is then placed on tube 11 in contact with guide ring 5. An electrode 13, in the form of a parallel plate electrode, is inserted through the central opening of body 3 such that the electrode head is within tube 11. Body 3 is threadedly mated with cap 4 such that O-ring 6A provides a tight seal. An O-ring 6B is placed around the shaft of electrode 13 within a cavity of the other threaded end of body 3. A second guide ring 7 with a central opening slightly larger than the shaft of electrode 13 is placed on electrode 13 in contact with O-ring 6B. A second U-shaped cap 8 with a central opening slightly larger than the exterior shape of electrode 13 is mounted on electrode 13. The inner surface of cap 8 is threaded so as to mate with the other threaded end of body 3. Cap 8 is threadedly mated with body 3 such that O-ring 6B provides a tight seal. A similar endcap may be used for other embodiments of the instant invention.

An incoming gas line 18 (FIG. 1A) runs from a gas source (not shown) to a valve 14A on incoming end 12A of tube 11. An outgoing gas line 19, downstream from valve 14B and pump 15, runs from the other end of tube 11. Outgoing gas line 19 runs out from a pump 15. Valves 14A, 14B are placed at or near each end 12A, 12B. Valves 14A, 14B may be opened/closed in several ways, including but not limited to, manually and pneumatically. A pressure measuring device 16 is connected to tube 11 so as to measure pressure within tube 11.

A factor affecting uniformity of illumination is the uniformity of pressure within tube 11 along the length of tube 11. For increased uniformity of illumination, a planar light source is ideal as the planar light source provides greater illumination surface area over an object than that provided by a point light source. The larger illumination surface area provides greater uniformity of illumination over the surface area of an object exposed to the planar light source. In terms of lamp shape, this translates into a lamp with relatively planar illumination surfaces. For example, if a lamp has a number of sections created by bends in the tube, as seen in the serpentine (FIG. 1C), spiral (FIG. 5), and channel-shaped (FIGS. 7A & 7B) light source described in more detail below, each section of the lamp should be located, approximately, in the same plane as its neighboring section(s) so as to approximate planar illumination, thereby increasing uniformity of illumination. The spacing of each section of the lamp relatively close to its neighboring section(s) increases the illumination surface area over an object, thereby increasing uniformity of illumination. The rectangular-shaped (FIGS. 4A & 4B) light source provides relatively uniform planar illumination.

Figure 1C:
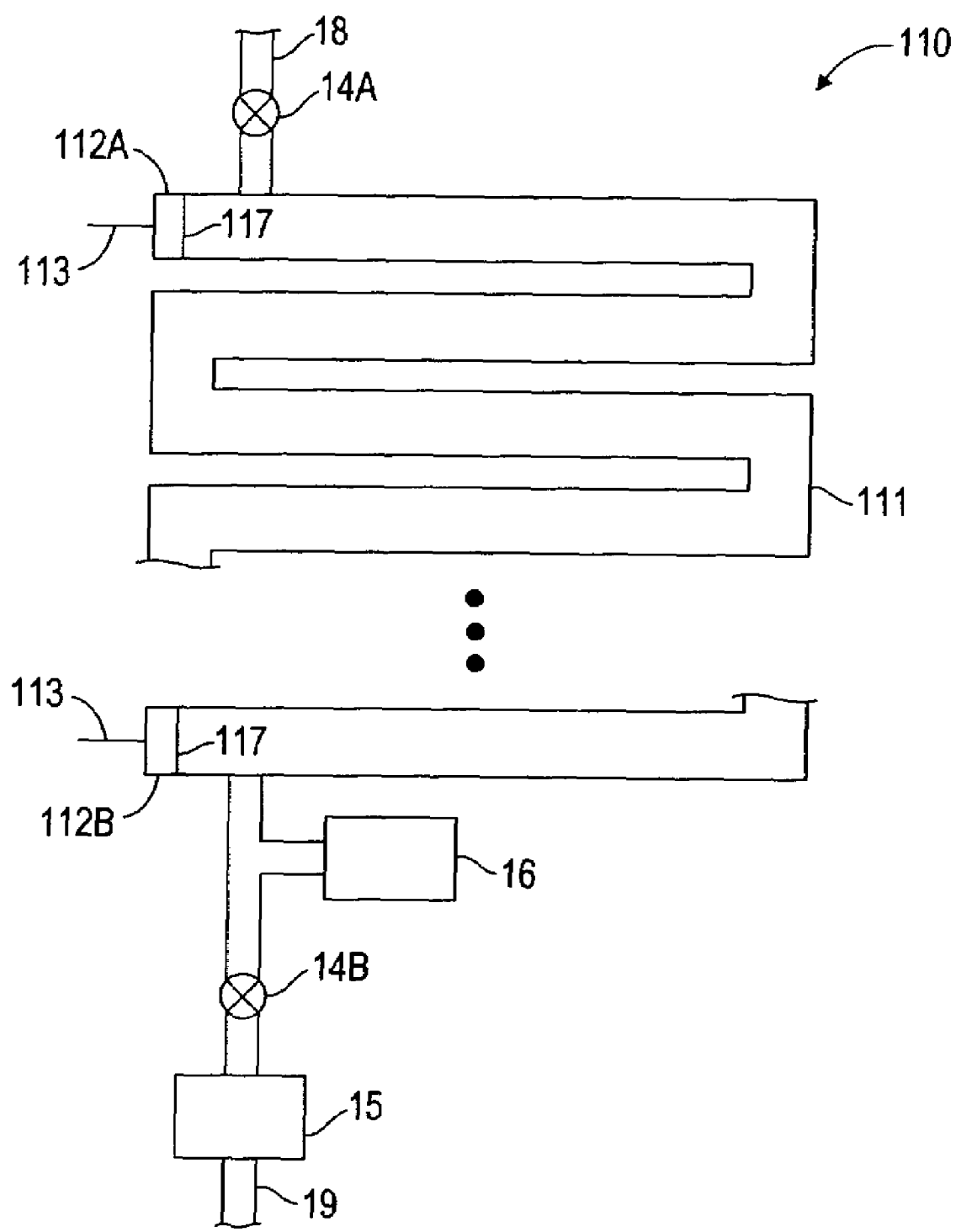
FIG. 1C illustrates a serpentine light source.

Another embodiment of the invention includes a serpentine-shaped tube, as seen in FIG. 1C, at constant pressure and constant current. This light source 110 includes a single tube 111 with two sealed ends 112A, 112B. Endcaps 117 are on ends 112A, 112B of tube 111. Tube 111 is shaped in a serpentine manner with a plurality of bends along the length of tube 111. Tube 111 is relatively planar from one end 112A to the other end 112B along the length of tube 111. Each endcap 117 of tube 111 has an electrode 113 for power. An incoming gas line 18 runs from a gas source (not shown) to a valve 14A on incoming end 112A of tube 111. Valves 14A, 14B, placed at or near each end 112A, 112B, respectively, may be opened/closed in several ways, including but not limited to, manually and pneumatically. A pump 15 for pumping the gas is operationally connected to valve 14B on outgoing end 112B of tube 111. An outgoing gas line 19 runs out from pump 15. Pressure measuring device 16 is connected to tube 111 so as to measure pressure within tube 111. The flat serpentine structure, among other factors, contributes to the overall effect of uniform illumination. Another factor affecting uniformity of illumination is the uniformity of pressure within tube 111 along its length.

The multi-spectral light source can be set up in a number of configurations depending on the selection by the user of various features, such as valves 14, pumps 15 and pressure measuring devices 16. Two examples of these possible configurations are a sealed operation mode and a continuous gas flow mode.

Figure 2A:
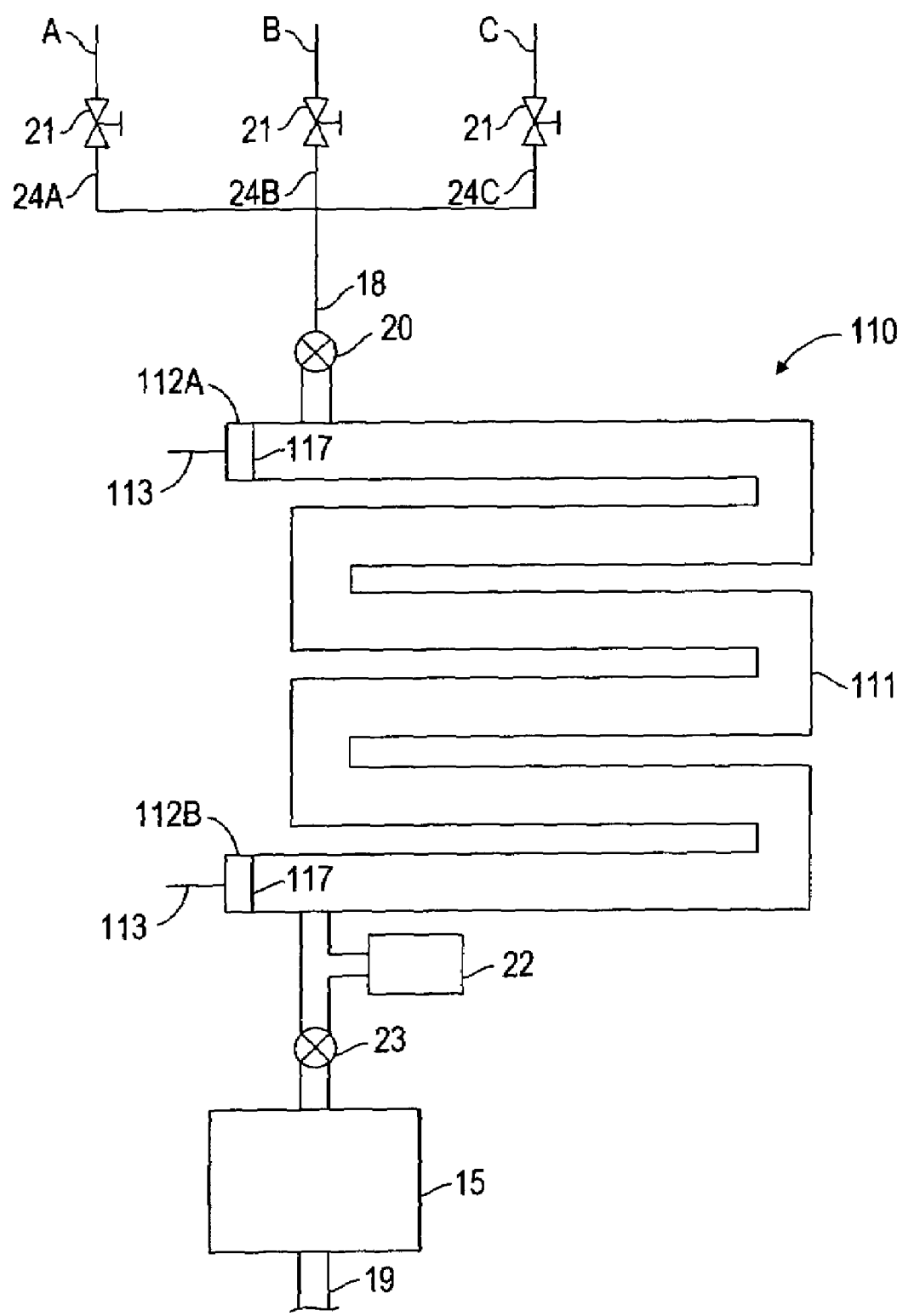
FIG. 2A illustrates a sealed operation serpentine light source.

The sealed operation mode is illustrated using a serpentine-shaped tube 111, as seen in FIG. 2A. The sealed operation mode seals tube 111 once tube 111 has been filled with a chosen gas at a desired pressure. In this example, three different gases (A, B, C) may be chosen to fill tube 111 though any number of different gases and mixtures thereof may be chosen. Each gas A, B, C has a separate line 24A, 24B, 24C that merges into a single incoming gas line 18 leading to a gas manifold valve 20. Each gas line 24 has a needle valve 21 between the gas manifold valve 20 and the source of the gas (A, B, C). The gas manifold valve 20 is operationally connected to tube 111. Each end 112A, 112B of tube 111 has an electrode 113 for power. A pressure gauge 22 is operationally connected at one end of the light source. A pump 15 is operationally connected to an open/close valve 23 located between pressure gauge 22 and pump 15. An outgoing gas line 19 runs out from pump 15.

Figure 2B:
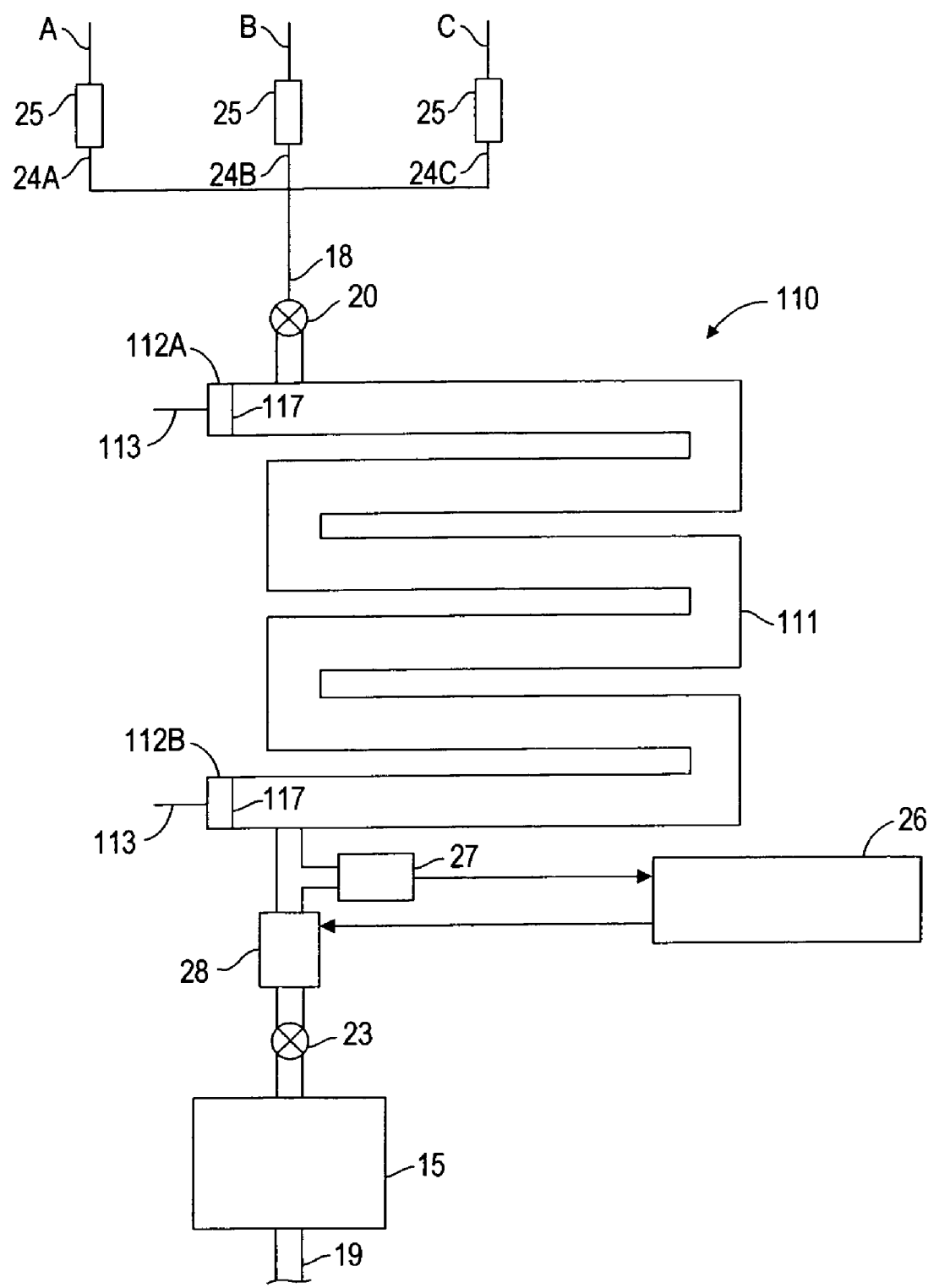
FIG. 2B illustrates a continuous gas flow operation serpentine light source.

The continuous gas flow operation mode is also illustrated using a serpentine-shaped tube 111, as seen in FIG. 2B. The continuous gas flow operation mode allows a continuous flow of gas through tube 111 at a desired pressure. In this example, three different gases (A, B, C) may be chosen to fill tube 111 though any number of different gases and mixtures thereof may be chosen. Gas A, Gas B, and Gas C each have a separate line 24A, 24B, 24C that merges into a single incoming gas line 18 leading to a gas manifold valve 20. Each gas line 24A, 24B, 24C has a mass flow controller 25 between gas manifold valve 20 and the source of the gas (A, B, C). Gas manifold valve 20 is operationally connected to tube 111. Each end 112A, 112B of tube 111 has an electrode 113 for power. A pressure controller 26 is operationally connected to the light source via a pressure transducer 27 and throttle valve 28. A pump 15 is operationally connected to an open/close valve 23 located between throttle valve 28 and pump 15. An outgoing gas line 19 runs out from pump 15.

Figure 3:
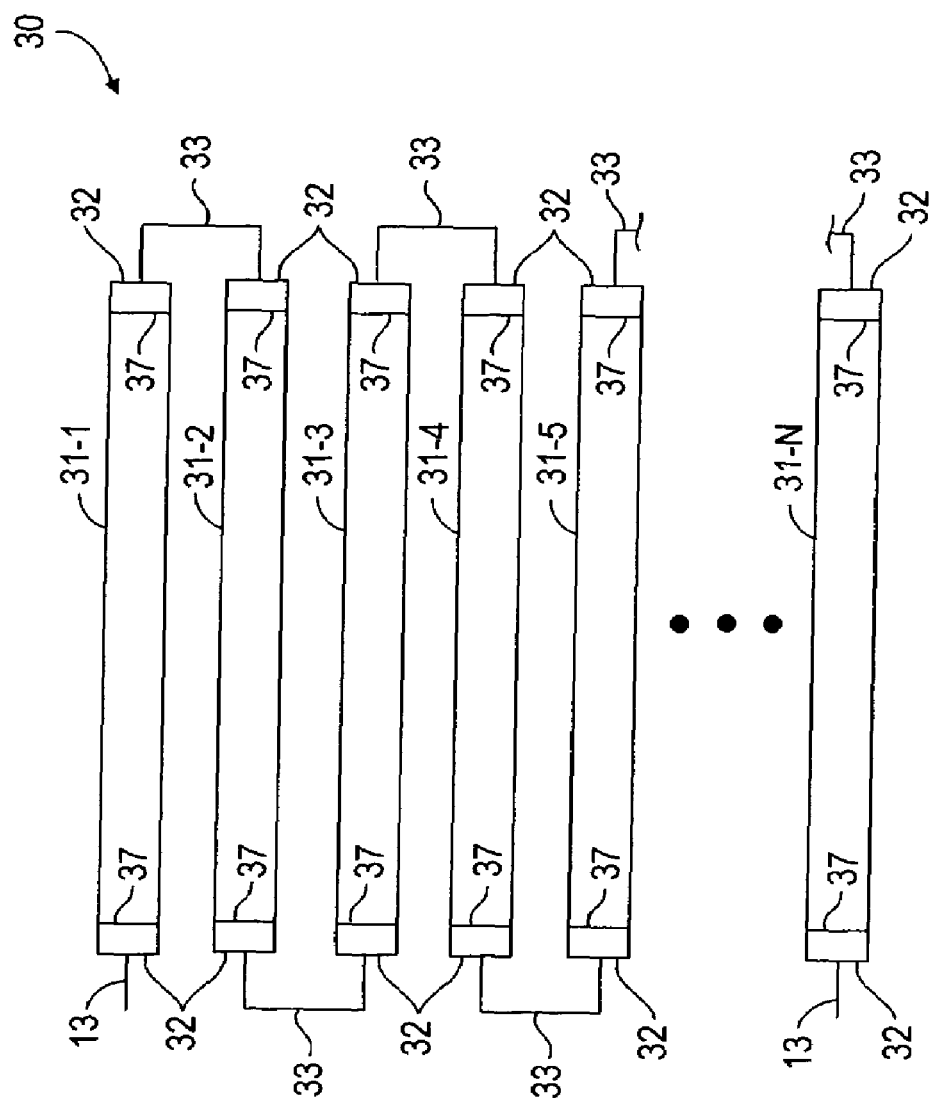
FIG. 3 illustrates an array of serially-connected light sources.

In accordance with this invention, a third embodiment of the invention includes a lamp array 30 of N serially connected, relatively planar straight tubes 31-1 to 31-N (where N is a selected integer), as seen in FIG. 3. The array 30 includes a plurality of individual straight tubes 31-1 to 31-N, each tube having two sealed ends 32. Endcaps 37 are on ends 32 of each of tubes 31-n (where 1≦n≦N). A parallel plate 33 or other filament serves as an electrode and connects endcaps 37 of neighboring tubes 31-n and 31-(n+1) or 31-n and 31-(n−1). Each parallel plate 33 (there are N-1 parallel plates in the structure of FIG. 3) provides a relatively large electrode area to maximize uniform discharge.

Figure 8A:
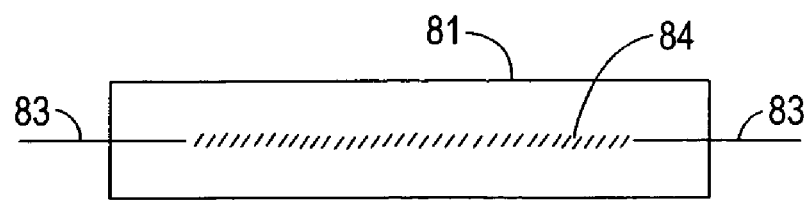
FIGS. 8A & 8B and 9A & 9B illustrate light tubes with different electrode structures and different internal gas pressures.
Figure 8B:
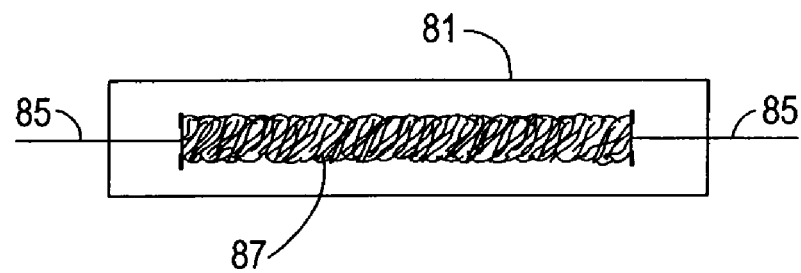

It is preferred to use a parallel plate 33 electrode since a point electrode does not provide as uniform a discharge as an electrode with a larger contact area because the larger the electrode area, the more uniform the discharge. As seen in FIG. 8A, tube 81 includes a point electrode 83 at each of end of tube 81. When tube 81 is connected to a power source, a streaky gas discharge 84 is produced within tube 81 due to the minimal contact area provided by point electrodes 83. FIG. 8B illustrates tube 81 fitted with parallel plate electrodes 85 at each end. When tube 81 is connected to a power source, a more uniform gas discharge 87 is produced within tube 81 due to the larger contact area provided by parallel plate electrodes 85.

FIG. 3 illustrates electrodes 33 connected to each tube 31-n electrically connected in series with the two adjacent tubes (except for the first and Nth tubes which are connected in series to only one adjacent tube). The electrodes 33 connecting the tubes 31-1 to 31-N in series may be any shape, including but not limited to a straight electrode, U-shaped electrode, and V-shaped electrode. For example, a relatively U-shaped electrode 33 is shown in FIG. 3. U-shaped electrode 33 is placed such that one end of the "U" is on one end 32 of a first tube 31-n while the other end of the "U" is on one end 32 of the neighboring tube 31-n+1. Tubes 31-1, 31-N each have one end 32 that uses electrode 13. The potential drawback to an array 30 of tubes 31-n is that different pressures or impedances in the tubes 31-1 to 31-N may make light emitted from the array 30 appear to be less than uniform.

In the case of lamp array 30, each individual lamp tube is sealed with its own internal pressure. If all lamps within lamp array 30 are connected in series, the current through each individual lamp will be the same. If the pressures within each tube are not significantly different, the light output from each tube will be very close. For example, the light intensity from fluorescent lamps connected in series is almost the same even though the fill pressure of each lamp may be slightly different.

Figure 9A:
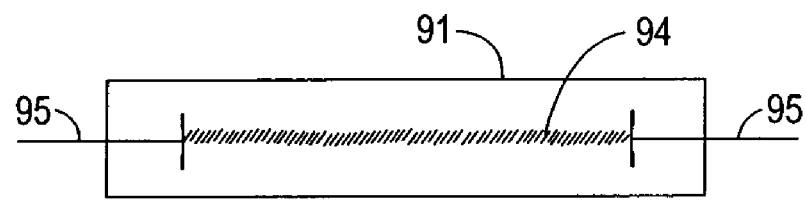
Figure 9B:
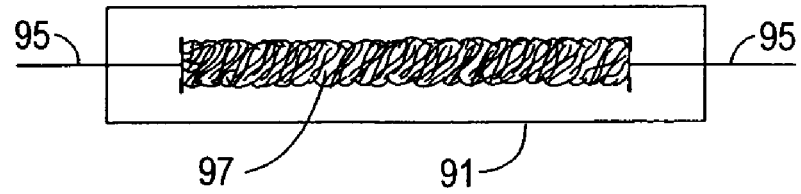

Pressure differences affect light uniformity. As seen in FIG. 9A, tube 91 includes a parallel plate electrode 95 at each end of tube 91. When tube 91, containing gas at relatively high pressure, is connected to a power source, depending on the gas used inside tube 91, a streaky gas discharge 94 is produced within tube 91 due in part to the relatively high gas pressure. FIG. 9B also illustrates tube 91 fitted with parallel plate electrodes 95 at each end. Tube 91 contains the same gas used in FIG. 9A, only now the gas is at a relatively low pressure. When tube 91 is connected to a power source, a more uniform gas discharge 97 is produced within tube 91 due in part to the relatively low pressure. If the lamp is used as a plasma lamp, a typical low pressure is approximately 0.1 milliTorr and a typical high pressure is approximately 10 Torr. If the lamp is used as a flash lamp or arc lamp, a typical low pressure is approximately 100 Torr and a typical high pressure is approximately 1520 Torr (2 ATM).

Light emitted from one tube 31-n may be brighter than light emitted from a neighboring tube 31-n−1 or 31-n+1. To compensate, lamp tubes 31-n are connected in series so that current through all the lamp tubes 31 will be the same.

Additionally, relatively close spacing of tubes 31-n increases the illumination surface area over an object, and thus increases uniformity of illumination. The individual tubes 31-n of this light array 30 may also be constructed with valves, pumps and gas lines in the manner disclosed above and in FIG. 1A such that the gases in each tube 31-n may be exchanged.

In accordance with this invention, a fourth embodiment of the invention includes a light source 45 comprising a single rectangular planar tube 40, as seen in FIGS. 4A and 4B at constant pressure and constant current. Single rectangular wide area planar tube 40 has two ends 41A, 41B with an electrode 42 placed at each end. Endcap 47 (not shown) is configured to the shape of tube 40 and one endcap 47 is placed on each end 41A, 41B of tube 40. A conductor 43 runs along the width of each end 41A, 41B of tube 40 so as to provide uniform illumination. Uniform illumination along the width of tube 40 results from conductor 43 being in contact with gas along the width of tube 40. Each conductor 43 is in contact with an electrode 42. The distance between electrodes 42 is constant so as to prevent arcing. Pressure inside and outside the envelope 40 is kept in close proximity to prevent the lamp from breaking. As discussed above, a tube with a rectangular cross-section is not as structurally strong as a tube of equal thickness with a circular cross-section. Thus, keeping internal and external pressures in relative equilibrium reduces stress on a rectangular tube. If the lamp is used in a vacuum environment, gas(es) inside the lamp must be low pressure. If the lamp is used in an environment at atmospheric pressure, gas(es) inside tube 40 must be close to atmospheric pressure (i.e., slightly above, at, or slightly below, atmospheric pressure). An incoming gas line 18 runs from a gas source (not shown) to a valve 14A on incoming end 41A of tube 40. Valves 14A, 14B are placed at or near each end 41A, 41B. Valves 14A, 14B may be opened/closed in several ways, including but not limited to, manually and pneumatically. A pump 15 for pumping the gas is operationally connected to a valve 14B on outgoing end 41B of the tube 40. An outgoing gas line 19 runs out from pump 15. A pressure measuring device 16 is connected to tube 40 so as to measure pressure within tube 40. A factor affecting uniformity of illumination is the uniformity of pressure within tube 40 along the length of tube 40. When there is no gas flow (i.e., the lamp is sealed), pressure will be uniform within and across the tube.

Figure 5:
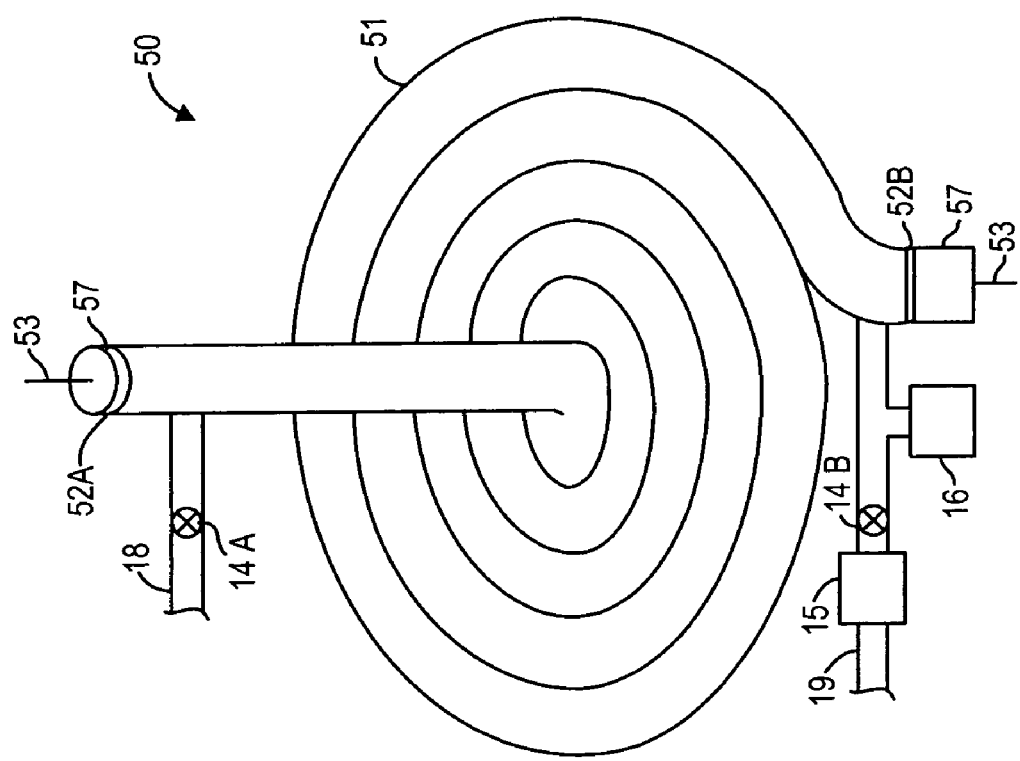
FIG. 5 illustrates a spiral-shaped light source.

In accordance with this invention, a fifth embodiment of the invention includes a spiral-shaped tube 51, as seen in FIG. 5, at constant pressure and constant current. Light source 50 includes a single spiral-shaped tube or envelope 51 with two sealed ends 52A, 52B. Each end 52A, 52B of tube 51 has an endcap 57. Each endcap 57 of tube 51 has an electrode 53 for power. An incoming gas line 18 runs from a gas source (not shown) to a valve 14A on incoming end 52A of the tube. Valves 14A, 14B are placed at or near each end 52A, 52B. Valves 14A, 14B may be opened/closed in several ways, including but not limited to, manually and pneumatically. A pump 15 for pumping the gas is operationally connected to valve 14B on outgoing end 52B of tube 51. An outgoing gas line 19 runs out from pump 15. A pressure measuring device 16 is connected to tube 51 so as to measure pressure within tube 51. A factor affecting uniformity of illumination is the uniformity of pressure within tube 51 along the length of tube 51.

Figure 6:
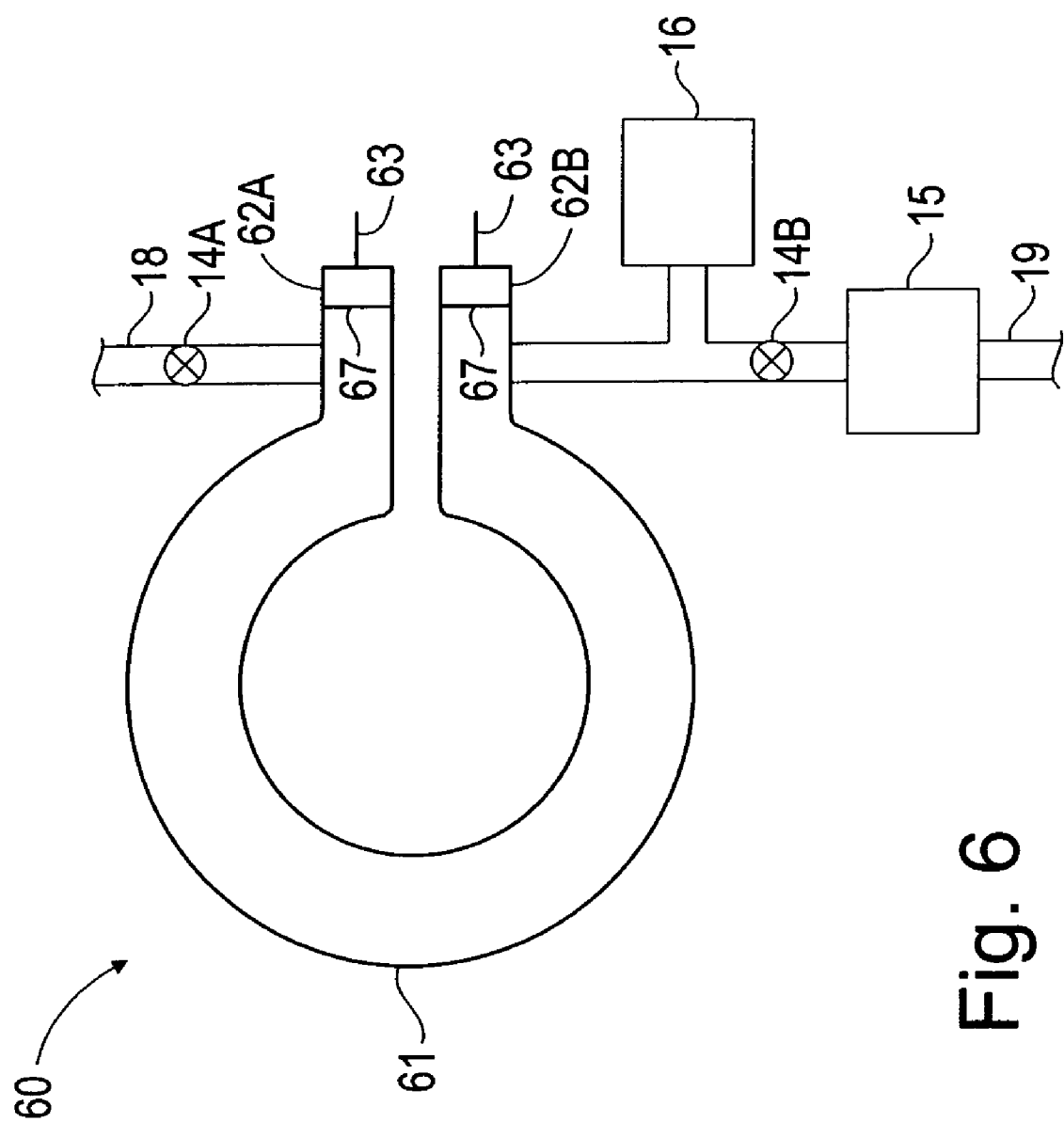
FIG. 6 illustrates a circular or ring-shaped light source.

In accordance with this invention, a sixth embodiment of the invention includes a circular or ring-shaped tube 61, as seen in FIG. 6, at constant pressure and constant current. This light source 60 includes a single open ring-shaped tube or envelope 61 with two sealed ends 62A, 62B. Each end 62A, 62B of tube 61 has an endcap 67. Each endcap 67 of tube 61 has an electrode 63 for power. An incoming gas line 18 runs from a gas source (not shown) to a valve 14A on incoming end 62A of tube 61. Valves 14A, 14B are placed at or near each end 62A, 62B. Valves 14A, 14B may be opened/closed in several ways, including but not limited to, manually and pneumatically. A pump 15 for pumping the gas is operationally connected to valve 14B on outgoing end 62B of tube 61. An outgoing gas line 19 runs out from pump 15. A pressure measuring device 16 is connected to tube 61 so as to measure pressure within tube 61. A factor affecting uniformity of illumination is the uniformity of pressure within tube 61 along the length of tube 61. If a lamp is sealed and there is no gas flowing into and out from the tube, pressure within and across the tube will be uniform.

Figure 7B:
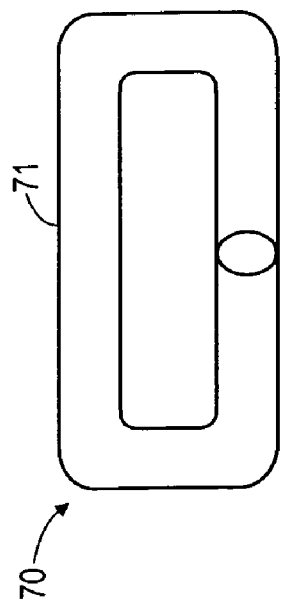
FIG. 7B illustrates a cross-section of the channel-shaped light source of FIG. 7A.
Figure 7A:
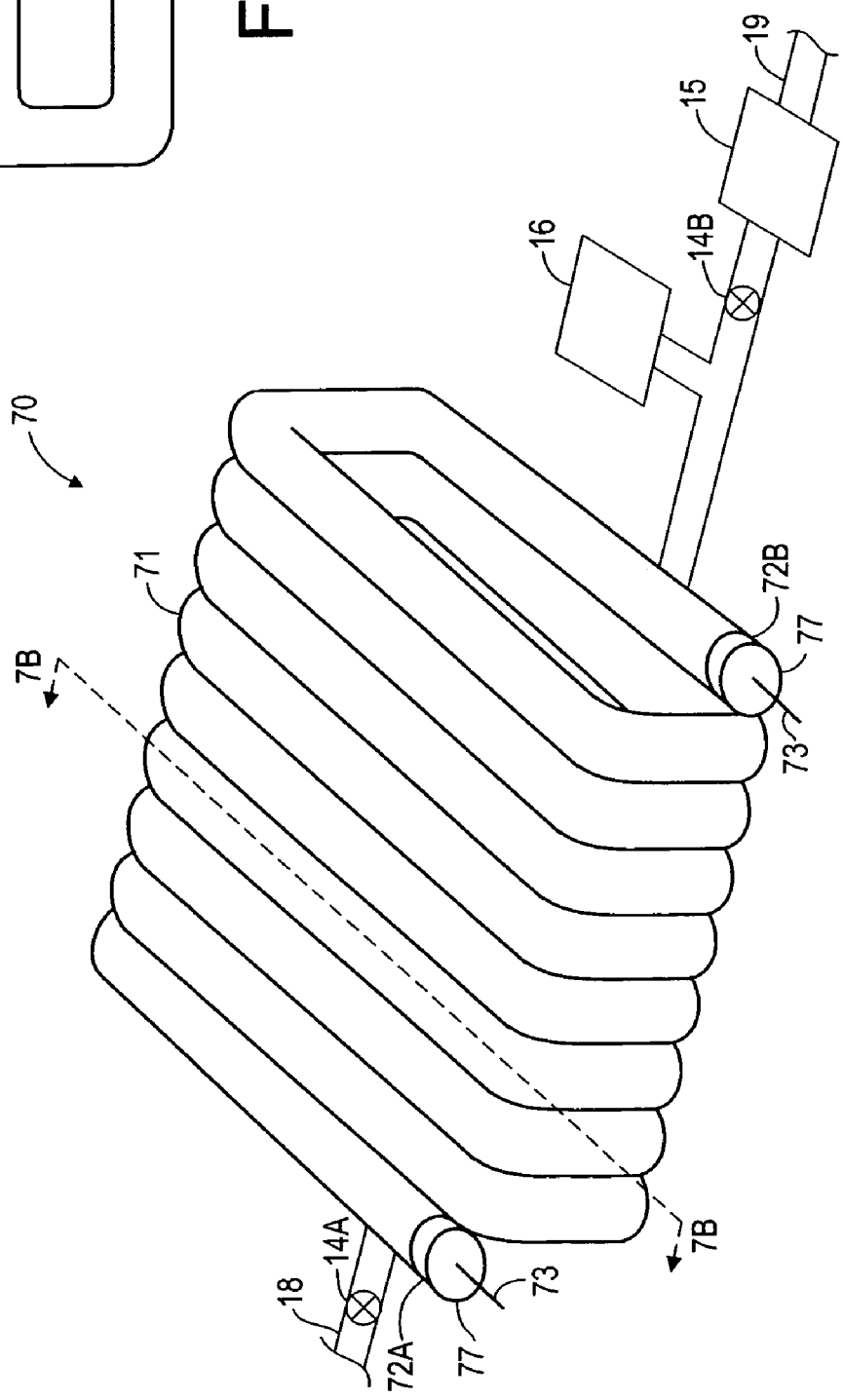
FIG. 7A illustrates a perspective view of a channel-shaped light source.

In accordance with this invention, a seventh embodiment of the invention includes a channel-shaped tube 71, essentially a tube coiled and bent so as to create a channel along the length of the tube in the form of a rectangular cross-section, as seen in FIGS. 7A and 7B, at constant pressure and constant current. Channel-shaped tube 71 could also be shaped so as to have a circular, triangular, square, pentagonal, hexagonal or other polygonal cross-section. This light source 70 includes a single tube or envelope 71 with two sealed ends 72A, 72B. Each end 72A, 72B of tube 71 has an endcap 77. Each endcap 77 of tube 71 has an electrode 73 for power. An incoming gas line 18 runs from a gas source (not shown) to a valve 14A on the incoming end 72A of the tube 71. Valves 14A, 14B are placed at or near each end 72A, 72B. Valves 14A, 14B may be opened/closed in several ways, including but not limited to, manually and pneumatically. A pump 15 for pumping the gas is operationally connected to valve 14B on outgoing end 72B of tube 71. An outgoing gas line 19 runs out from pump 15. A pressure measuring device 16 is connected to tube 71 so as to measure pressure within tube 71. A factor affecting uniformity of illumination is the uniformity of pressure within tube 71 along the length of tube 71.

Gases that may be used inside tubes 11, 111, 31, 40, 51, 61, 71 include, but are not limited to, krypton (Kr), argon (Ar), neon (Ne), xenon (Xe), helium (He), mercury (Hg), neon/helium mixture, neon/argon mixture, oxygen ($O_2$), hydrogen ($H_2$), chlorine (Cl), carbon dioxide ($CO_2$), ditrium ($D_2$), ammonia ($NH_3$), nitrogen ($N_2$) and various mixtures of the preceding gases. All of the preceding gases may be mixed for all applications except for hydrogen and oxygen which may not be mixed together. Mercury has a vapor pressure at room temperature and room pressure which may cause mercury in the light source to solidify or liquefy so as to form a blind spot at the center of the light source. It is known in the art that reduction in the amount of mercury increases the speed at which a gas discharge light source is illuminated. However, for long duration processes, such as curing, the speed at which a curing light source illuminates is not a critical factor.

The wavelengths of light emitted by the gases stated above range from ultra-violet (U.V.) to infra-red (I.R.) and each gas emits its own unique line spectra (i.e., the wavelengths of light generated by each gas are concentrated in specific narrow bands of light rather than a continuous spectrum). The desired wavelength of emitted light depends upon the intended application for which the light is to be used. The wavelength of emitted light from a particular gas may be modified through use of a filter or monochromator. The wavelength of emitted light from a particular gas may also be modified through use of a particular lamp tube material (i.e., glass, PYREX, quartz, sapphire, or any other appropriate transparent or translucent material). The color of the emitted light may be modified by adding small amounts of mercury or mercury vapor to the gas within the tube. A phosphor or fluorescent coating may be placed on an inner surface of a tube in order to modify the light emitted from the tube to a desired wavelength.

The lamp may be operated while gases within the tube are exchanged. Once the gases are exchanged, remaining trace amounts of the exchanged gas(es) are permissible. If the lamp is being operated during the exchange of gases, a color change may result in the light emitted from the lamp tube 11, 111, 31, 40, 51, 61, 71. Color change is not merely an aesthetic change but may indicate, without limitation, that there has been a wavelength change, that a different spectra of light is being emitted, or that a gas exchange is occurring or has occurred. However, a color change may not occur, even though a gas exchange has occurred, as several gases may emit light over the same wavelengths even though each gas has its own unique spectra. As light wavelength shortens, photonic energy increases. If a user desires to modulate the amount of photonic energy emitted, a user would change the combination of gases to achieve the desired level of photonic energy emitted by the light source. As stated above, each gas produces light of a particular color when excited. As the gases are exchanged, the color of emitted light may change as the initial gas(es) is/are replaced by a new gas(es).

Various power sources, using well-known activation methods, may be used to power the light source including but not limited to devices that use high voltage DC (approximately 100 to 5,000 volts; approximately 1 microAmp to 500 Amps) or AC (including pulsed DC) (approximately 10 to 200 kHz; approximately 100 to 15,000 volts; approximately 1 microAmp to 500 Amps). One possible power source includes a high voltage transformer (rectified for DC, unrectified for AC) which itself is powered by a step-up transformer (itself powered by a line voltage of 10–480 volts) outputting 1500–15,000 volts to the high voltage transformer. Another possible power source is an RF generator (approximately 1 Watt to 10 kilowatts; 200 kHz to 5 GHz). When using an RF generator, the lamp electrodes may be electrically insulated. If the RF generator is set above 50 MHz, no electrode is necessary. No electrode is necessary for power sources using the microwave range (greater than 1 GHz). It is known that low pressure substantially reduces the amount of energy required to heat a gas to the point of excitation. It is also known that internal ceramically insulated electrodes aid in heat retention and long term performance. However, such insulated electrodes are useful mainly for high frequency power (typically in the RF range and above). For applications involving low frequency power (typically below the RF range), electrodes must be uninsulated and exposed.

Tubes 11, 111, 31, 40, 51, 61, 71 may be any size. For applications involving semiconductor manufacturing, tubes 11, 111, 31, 40, 51, 61, 71 may be wafer-sized with a tube diameter of 1 inch or less. The diameters of the spiral and serpentine-shaped tubes may vary between 8 to 12 inches although other diameters may also be used. The tubes 11, 111, 31, 40, 51, 61, 71 are made of a transparent material including, but not limited to, normal glass, PYREX, quartz crystal or sapphire. Lamp tubes 11, 111, 31, 40, 51, 61, 71 are manufactured using any number of conventional processes. For example, the straight tube 11 of FIG. 1A may be manufactured with conventional end caps and O-rings. Normal glass is not used for U.V. light applications for safety reasons. For UV applications, quartz is the preferred material. The material used for tubes 11, 111, 31, 40, 51, 61, 71 affects the transmittivity of the light which passes through tubes 11, 111, 31, 40, 51, 61, 71. As stated above, tubes 11, 111, 31, 40, 51, 61, 71 may also have phosphor or fluorescent coatings to modify the light emitted by the gases within the tubes. Tubes 11, 111, 31, 40, 51, 61, 71 can be pressurized in the range from 0.1 milliTorr to 1520 Torr. This allows the discharge lamp to be used for both high pressure and low pressure applications. The thickness, shape and material used determine the structural strength of a tube. As the thickness increases between the inner and outer dimensions of the wall(s) of a lamp tube, the structural strength of the tube increase. Although increasing the thickness of the wall(s) may increase the structural strength of a tube, the cross-sectional shape of the tube is another factor in determining structural strength. For example, a tube with a rectangular cross-section with wall(s) of a certain thickness is not as structurally strong as a tube with an oval cross-section with wall(s) of equal thickness to the walls of the rectangular tube. Likewise, the oval tube is not as structurally strong as a tube with a circular cross-section with wall(s) of equal thickness to the walls of the rectangular and oval tubes.

Various components are used to control the flow of gas, including but not limited to mass flow controllers 25 (FIG. 2B), open/close valves 14A (FIG. 1A, for example), 14B (FIG. 1A, for example), 23( FIGS. 2A & 2B), needle valves (manual or computer-controlled) 21 (FIG. 2A) and throttle valves 28 (FIG. 2B). The valves include seals to prevent gas from leaking past or through the valves from the tube. Throttle valves 28 are used to bring the gas to a desired pressure within tubes 11, 111, 31, 40, 51, 61, 71. Throttle valves 28 are structurally separate from the pump 15. Needle valves 21 provide manual control of gas flow, mass flow controllers 25 provide for automatic control of gas flow and gas manifold valves 20 turn gas flow on/off. Glass/metal seals, O-rings, or direct seals may be used as an interface between tubes 11, 111, 31, 40, 51, 61, 71 and the valves adjacent to tubes 11, 111, 31, 40, 51, 61, 71.

Various pumps 15 may be used for moving gases through tubes 11, 111, 31, 40, 51, 61, 71, including but not limited to, mechanical pumps, rotary pumps, gas pumps, vacuum pumps and air pumps. A flowmeter may be used with pump 15 to control the flow of gas. A pressure gauge 22 is used to determine pressure within the tube 11, 111, 31, 40, 51, 61, 71.

The method of gas replacement depends on whether the desired internal pressure of the tube 11, 111, 31, 40, 51, 61, 71 is above, at or below atmospheric pressure. When the gas inside the tube 11, 111, 31, 40, 51, 61, 71 is at or below one atmospheric pressure (1 ATM=760 Torr), the following method (illustrated in conjunction with the serpentine-shaped tube 111 of FIG. 1C) is used to provide the desired gas and pressure within the tube. Pump 15, a vacuum pump, is activated and begins creating a vacuum on the pump 15 side of closed valve 14B. Incoming gas line valve 14A is closed to cut off any incoming flow of gas into tube 111. Outgoing gas line valve 14B is opened to allow gas within tube 111 to be drawn out by pump 15. Pump 15 evacuates the gas within tube 111. Lamp tube 111 is evacuated to base pressure; the lowest pressure possible in the system without gas flow. Base pressure is a function of factors that include pump size, lamp volume, leak rate, tube size, and tube length. Valve 14B is closed once base pressure is reached. Valve 14A is then opened to allow new gas to flow into tube 111. Valve 14A is closed when gas pressure within tube 111 reaches a desired pressure.

When the gas inside a tube is above one atmospheric pressure, the following method (illustrated in conjunction with the serpentine-shaped tube 111 of FIG. 1C) is used to provide the desired gas and pressure within the tube. It is not necessary to use a vacuum pump when the gas in tube 111 is to be above one atmospheric pressure. Valve 14A is opened to allow new gas to flow into tube 111 which is already filled with old gas. Valve 14B is opened to allow the old gas to flow out of tube 111. The new gas continues to flow into tube 111. Valve 14B is closed after a desired amount of new gas has entered tube 111. After valve 14B has been closed, gas pressure increases inside tube 111 as new gas continues to flow into tube 111. Valve 14A is closed when the gas pressure inside tube 111 reaches a desired pressure. After valve 14A is closed, gas flow into tube 111 ceases. By flowing new gas into the lamp, the old gas still within tube 111 is diluted as new gas flows into tube 111. The dilution of the old gas progresses as additional new gas flows into the lamp. If an amount of new gas equal to several times the tube's internal volume flows into the lamp, the old gas concentration becomes negligible. If the concentration of old gas is less than 5%, the effect of the old gas is negligible.

The above-described embodiments of the present invention are illustrative only and not limiting. It will thus be obvious to those skilled in the art that various changes and modifications may be made without departing from this invention in its broader aspects. Therefore, the appended claims encompass all such changes and modifications as falling within the true spirit and scope of this invention.

I claim:

1. A method of modulating a light source, the method comprising:
   providing a hollow tube having a first end with a first endcap and a second end with a second endcap, an inlet valve and a first electrode associated with the first end and an outlet valve and a second electrode associated with the second end;
   opening the inlet and outlet valves to provide for a simultaneous modification of gases between said first electrode and said second electrode;
   flowing a portion of a first gas from between said first and second electrodes out of the light source through the outlet valve, and simultaneously flowing a second gas through the inlet valve into between said first and second electrodes, said first gas being different from said second gas;
   providing power to the first and second electrodes during the flowing of the first and second gases to modulate the light source; and
   closing the inlet and outlet valves.

2. The method of claim 1, wherein the first gas is selected from the group consisting of: inert gases, krypton, argon, neon, xenon, helium, mercury, neon/helium mixture, neon/argon mixture, oxygen, hydrogen, ditrium, and nitrogen.

3. The method of claim 1, wherein the second gas is selected from the group consisting of: inert gases, krypton, argon, neon, xenon, helium, mercury, neon/helium mixture, neon/argon mixture, oxygen, hydrogen, ditrium, and nitrogen.

4. The method of claim 1, wherein the first gas is selected from the group consisting of: inert gases, krypton, argon, neon, xenon, helium, mercury, neon/helium mixture, neon/argon mixture, oxygen, hydrogen, ditrium, and nitrogen; and the second gas is selected from the group consisting of: inert gases, krypton, argon, neon, xenon, helium, mercury, neon/helium mixture, neon/argon mixture, oxygen, hydrogen, ditrium, and nitrogen.

5. The method of claim 1, wherein the inlet and outlet valves include seals to prevent gas from leaking past or through the valves from the tube.

6. The method of claim 1, wherein the hollow tube comprises a straight hollow tube shape.

7. The method of claim 1, wherein the hollow tube comprises a serpentine shaped hollow tube.

8. claim 1 The method of claim 1, wherein the light source comprises a lamp array of serially connected light sources.

9. The method of claim 1, wherein the hollow tube comprises a rectangular planar shaped hollow tube.

10. The method of claim 1, wherein the hollow tube comprises a spiral shaped hollow tube.

11. The method of claim 1, wherein the hollow tube comprises a ring shaped hollow tube.

12. The method of claim 1, wherein the hollow tube comprises a channel shaped hollow tube.

* * * * *